(12) United States Patent
Chiang et al.

(10) Patent No.: US 9,508,590 B2
(45) Date of Patent: Nov. 29, 2016

(54) METHODS AND APPARATUS OF METAL GATE TRANSISTORS

(71) Applicant: Taiwan Semiconductor Manufacturing Company, Ltd., Hsin-Chu (TW)

(72) Inventors: Tsung-Yu Chiang, New Taipei (TW); Kuang-Hsin Chen, Jung-Li (TW); Bor-Zen Tien, Hsin-Chu (TW); Tzong-Sheng Chang, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/996,951

(22) Filed: Jan. 15, 2016

(65) Prior Publication Data

US 2016/0133509 A1 May 12, 2016

Related U.S. Application Data

(62) Division of application No. 13/773,385, filed on Feb. 21, 2013, now Pat. No. 9,252,259.

(51) Int. Cl.

| H01L 21/768 | (2006.01) |
| H01L 29/78 | (2006.01) |
| H01L 21/28 | (2006.01) |
| H01L 29/49 | (2006.01) |
| H01L 29/51 | (2006.01) |
| H01L 21/3213 | (2006.01) |
| H01L 29/06 | (2006.01) |
| H01L 29/66 | (2006.01) |

(52) U.S. Cl.
CPC ... *H01L 21/76805* (2013.01); *H01L 21/28088* (2013.01); *H01L 21/32134* (2013.01); *H01L 21/32135* (2013.01); *H01L 21/76877* (2013.01); *H01L 29/0649* (2013.01); *H01L 29/4966* (2013.01); *H01L 29/51* (2013.01); *H01L 29/66568* (2013.01); *H01L 29/78* (2013.01)

(58) Field of Classification Search
CPC .......... H01L 29/513; H01L 21/28194; H01L 29/78; H01L 21/76805
See application file for complete search history.

(56) References Cited

U.S. PATENT DOCUMENTS

| 2002/0079536 | A1* | 6/2002 | Terauchi | ........... H01L 21/76804 257/332 |
| 2005/0186792 | A1* | 8/2005 | Takahashi | ......... H01L 21/31116 438/673 |
| 2007/0026597 | A1 | 2/2007 | Nakajima | |
| 2010/0109056 | A1 | 5/2010 | Pal et al. | |
| 2010/0301425 | A1* | 12/2010 | Kang | ................ H01L 21/82346 257/384 |
| 2011/0062502 | A1 | 3/2011 | Yin et al. | |
| 2011/0111584 | A1 | 5/2011 | Chen et al. | |
| 2011/0210403 | A1* | 9/2011 | Teo | ................... H01L 21/82384 257/401 |

FOREIGN PATENT DOCUMENTS

KR      20050104077 A1    11/2005

\* cited by examiner

*Primary Examiner* — Christine Enad
(74) *Attorney, Agent, or Firm* — Slater Matsil, LLP

(57) ABSTRACT

In some embodiments, a method of manufacturing a device includes providing a first device with an isolation area, an active area next to the isolation area, a metal gate above the isolation area and the active area, and a dielectric layer above the metal gate. The method also includes forming a first opening within a conductive layer of the metal gate, and a second opening within the dielectric layer. The first opening and the second opening are connected, and are of a first shape. The method further includes expanding the first opening to form a third opening of a second shape within the conductive layer of the metal gate and beneath the dielectric layer, forming a first contact part by filling the third opening, and forming a second contact part by filling the second opening, the first contact part being connected to the second contact part.

20 Claims, 5 Drawing Sheets

METHODS AND APPARATUS OF METAL GATE TRANSISTORS

CROSS-REFERENCE TO RELATED APPLICATIONS

This application is a divisional of U.S. patent application Ser. No. 13/773,385, entitled "Methods and Apparatus of Metal Gate Transistors," filed on Feb. 21, 2013, which application is incorporated herein by reference.

BACKGROUND

The semiconductor industry has experienced rapid growths due to continuous improvements in the integration density of semiconductor devices (e.g., transistors, diodes, resistors, capacitors, etc.) and the continuous reduction in the critical dimension (CD) of semiconductor devices. With the continuous reduction of the CD of semiconductor devices, the scales of the gate, source and drain of a transistor decrease accordingly.

The gate of a transistor is the area where the critical on-off switching of the transistor takes place. Historically, doped polysilicon has been used as the gate electrode of CMOS transistors. When the gate dimension in a modern transistor is so thin, a gate leakage may occur through a process called "quantum mechanical tunneling." New generations of transistors may be made using metals to replace polysilicon gate electrodes. A metal gate enables a faster, and a more reliable performance for a transistor, with reduced gate leakage. These new metal gates may reduce the NMOS transistor gate leakage by more than 25 times and PMOS transistor gate leakage by more than 1000 times while simultaneously delivering improved drive current and improved circuit performance.

While the metal gate reduces the gate leakage for CMOS transistors, it can have a large resistance, which can lead to a low yield for the transistor fabrication process. New methods and apparatus are needed to reduce the resistance of a metal gate for the transistors.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure. Throughout the various views and illustrative embodiments, like reference numbers are used to designate like elements.

In the following description, embodiments are disclosed in the context of forming a contact for a metal gate transistor so that the metal gate has a smaller resistance. The device may comprise an active area, an isolation area surrounding the active area, and a metal gate above the isolation area, wherein the metal gate comprises a conductive layer. The device further comprises a contact, wherein the contact comprises a first contact part formed within the conductive layer of the metal gate, above the isolation area without vertically overlapping the active area, and a second contact part above the first contact part, physically connected to the first contact part, and substantially vertically contained within the first contact part. The larger first contact part is formed because a larger part of the conductive layer of the metal gate is removed, therefore the resistance of the metal gate is reduced.

Figure 1A:
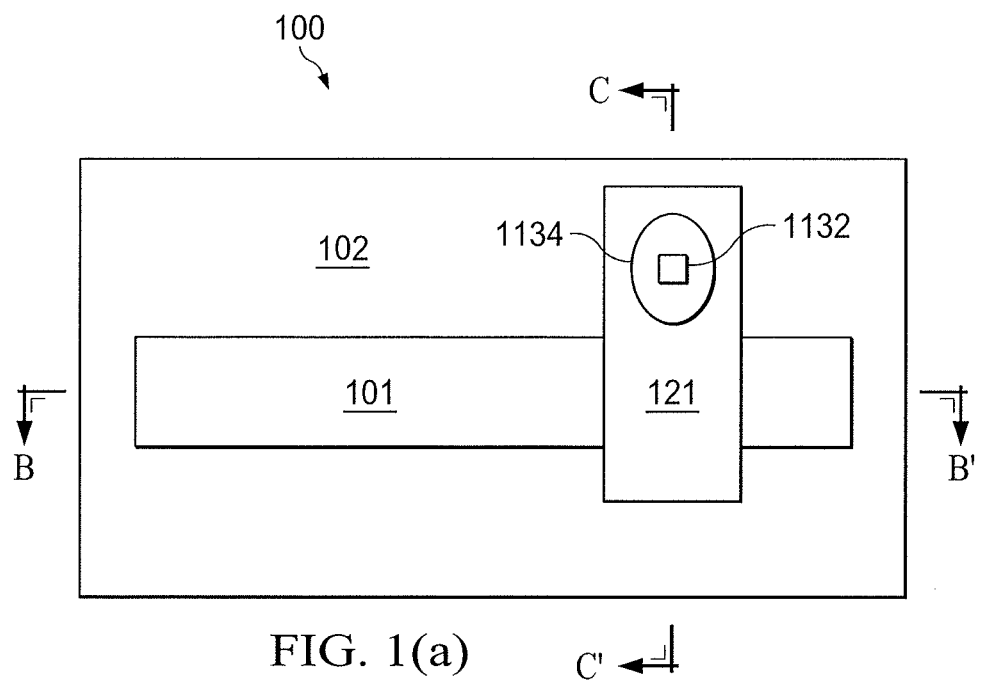
FIGS. 1(a)-1(c) illustrate cross-sectional views and a top view of a metal gate transistor with a contact in accordance with some embodiments.
Figure 1B:
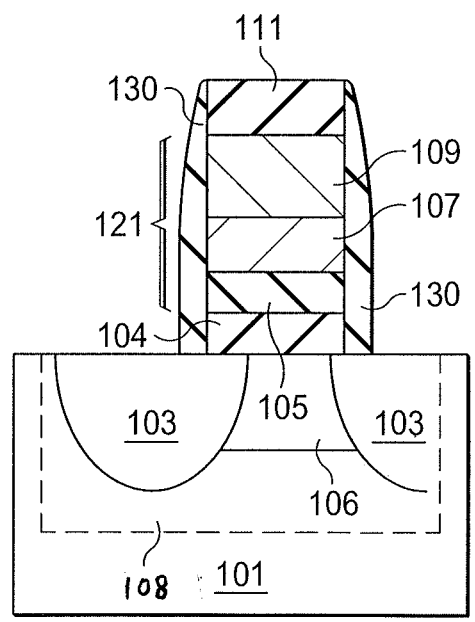
Figure 1C:
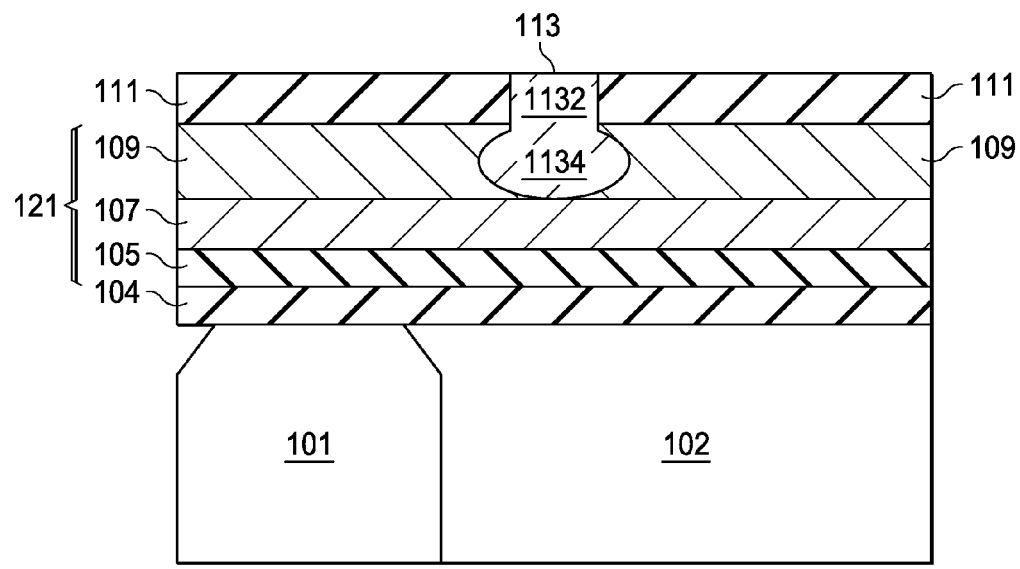

As illustrated in FIG. 1(a) in a top-down view and in FIGS. 1(b) & 1(c) in cross-sectional views, a transistor 100 is shown, which may be a NMOS transistor or a PMOS transistor in an embodiment. The transistor 100 has a metal gate 121, and an active area 101, wherein the active area 101 comprises source/drain regions 103, and a channel 106 between the two source/drain regions 103 under the metal gate 121. The active area 101 is surrounded by an isolation area 102. Both the active area 101 and the isolation area 102 may be formed within a substrate.

The metal gate 121 is formed above the isolation area 102 and above the channel 106 in the active area 101. The metal gate 121 may comprise a plurality of layers, such as a conductive layer 109 as shown in FIG. 1(c), along the cross-section line C-C'. The metal gate 121 may further comprise other layers such as a work function layer and a metal stop layers. The layers shown are merely as an example. There may be more or fewer layers for the metal gate 121, which are all within the scope of the present disclosure.

The transistor 100 further comprises a contact 113 connected to the metal gate 121, wherein the contact 113 comprises a first contact part 1134 within the conductive layer 109 of the metal gate 121, and a second contact part 1132 vertically above and physically connected to the first contact part 1134. The first contact part 1134 is substantially vertically above the isolation area 102, without overlapping the active area 101. By keeping the first contact part 1134 over the isolation area 102, the threshold voltage Vt mismatch risk can be prevented or reduced.

The second contact part 1132 is substantially vertically contained within the first contact part 1134, so that the projected image of the second contact part 1132 onto the conductive layer 109 is substantially contained within the first contact part 1134, while the first contact part 1134 is within the conductive layer 109. The projected image of the second contact part 1132 onto the conductive layer 109 may be substantially vertically contained within the first contact part 1134 so that there is no intersection of the edge of the projected image of the second contact part 1132 with the edge of the first contact part 1134. Looking from above, the second contact part 1132 does not extend beyond the first contact part 1134. More details of the components of the transistor 100 may be illustrated in FIGS. 1(*b*) and 1(*c*) and described below.

The active area 101 with the metal gate 121 above the active area 101 is illustrated in FIG. 1(*b*), in a cross-section view along the cross-section line B-B' shown in FIG. 1(*a*). The active area 101 comprises the two source/drain regions 103, and a channel 106 between them. A high dielectric constant (high-k) layer 104 is formed above the channel 106. The metal gate 121 is formed on the high-k layer 104. A dielectric layer 111 is on the metal gate 121. Spacers 130 are around the metal gate 121, the high-k layer 104, and the dielectric layer 111.

The active area 101 may be a part of a circuit, a device, a die, or a wafer. The active area 101 may be formed within a substrate, such as a silicon substrate, semiconductor-on-insulator (SOI) substrate, a multi-layered or gradient substrate, or a substrate comprising compound semiconductor substrates, e.g., gallium arsenide, or alloy semiconductor substrate, e.g., silicon—germanium.

A well 108 may be formed within the active area 101. In an embodiment, the well 108 may be a p-type well to host the source/drain regions 103 of a NMOS transistor. Alternatively, the well 108 may be an n-type well to host the source/drain regions 103 of a PMOS transistor. For example, in an embodiment, the well 108 may be formed by implanting p-type ions, such as boron ions, at a dose of about 1E12 to about 1E14 atoms/cm$^2$ and at an energy of about 20 KeV to about 500 KeV. A high temperature thermal procedure may be performed, such as an annealing procedure, to drive and to activate the dopants in the p-type well 108 or the n-type well 108. In an embodiment, the well 108 may have a depth of about 10,000 Å to about 30,000 Å and a width of about 3,000 Å to about 10,000 Å. Other embodiments may utilize different depths, widths, and/or doping parameters.

The two source/drain regions 103 of the transistor 100 may be formed within the well 108. The channel 106 is formed between the source/drain regions 103. A recess for the source/drain region 103 may be first etched into the well 108. The etching of the recess may be performed by a dry plasma etching process. After forming the recess in the well 108, selective epitaxy may be performed to form the source/drain region 103.

The method described above for forming the source/drain regions 103 is merely an example, and is not limiting. There may be other methods used to form the source/drain regions 103. For example, in an embodiment, the gate 121 may be formed first, and then acts as a mask for forming the source/drain regions 103. This method and any other suitable methods are within the scope of the intended embodiments.

The high-k layer 104 may be formed above the channel 106 of the transistor. The high-k layer 104 may also be extended to be above the isolation area 102, as illustrated in FIG. 1(*c*). The high-k layer 104 may cover a part of the source/drain regions 103 as well. A "High-k" material may be a material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), and hafnium zirconium oxide ($HfZrO_4$). The high-k material may be deposited either by atomic layer deposition (ALD) or by molecular beam epitaxy (MBE), for example. Additionally, any other suitable dielectric material may be used in the high-k layer 104.

The metal gate 121 may be formed above the high-k layer 104. The metal gate 121 may comprise a plurality of layers, such as a work function layer 105, a metal stop layer 107, and the conductive layer 109. The metal gate 121 may have a similar length as a length of the high-k layer 104. The metal gate 121 covers the channel 106. The metal gate 121 may also cover a part of the source/drain regions 103. Gate spacers 130 may be formed on the sides of the metal gate 121 and the dielectric layer 111.

The work function layer 105 of the metal gate 121 alters the work function of the high-k layer 104, which affects the threshold voltage of the transistor 100. The thickness of the work function layer 105 may be from about 0.1 nm to about 50 nm, for example. The work function layer 105 may comprise a high-k material containing a metal and oxygen, such as one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Alternatively, the work function layer 105 may comprise an alkaline earth metal-containing compound, such as MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, $BaI_2$, and an alloy thereof.

The metal stop layer 107 of the metal gate 121 may be formed above the working function layer 105 and below the conductive layer 109, to act as an etch stop layer. The material of the metal stop layer 107 may be one or more of a number of different materials, such as aluminum, tantalum, copper, and gold, or an alloy such as TiN, TaN or TiAl. The thickness of the metal stop layer 107 depends, in part, upon the material employed. For example, in one embodiment, when the metal stop layer is made of TiN, its thickness may be in a range from about 0.1 nm to about 50 nm. Other materials or combinations of materials may be used without departing from the scope of the present disclosure.

The conductive layer 109 of the metal gate 121 may be formed over the metal stop layer 107. The thickness of the conductive layer 109 may be in a range between about 200 Å and about 5000 Å. In one embodiment, the conductive layer 109 may comprise hafnium, zirconium, titanium, tantalum, tungsten, aluminum, or an alloy or metal carbide thereof. Metal carbide may be hafnium carbide, zirconium carbide, titanium carbide, tantalum carbide, aluminum carbide or the like. In another embodiment, the conductive layer 109 may be formed of a metal silicide (e.g., titanium silicide, cobalt silicide, nickel silicide, tantalum silicide), a metal nitride (e.g., titanium nitride, tantalum nitride), or any other conductive materials. Combinations of these materials can be used. The conductive layer 109 may be formed by chemical vapor deposition (CVD), physical vapor deposition (PVD), ALD, vacuum evaporation, or the like.

A dielectric layer 111 may be formed over the metal gate 121. The dielectric layer 111 may comprise a low dielectric constant material, such as an oxide, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PE-TEOS), as examples. The dielectric layer 111 may be formed by CVD, PVD, or the like. A planarization process, such as a CMP process, may be performed to planarize the dielectric layer 111.

The various layers such as the high-k layer 104, the work function layer 105, the metal stop layer 107, the conductive layer 109, and the dielectric layer 111 may be patterned to form the part covering the channel 106. The patterning may be done using a photoresist coating material deposited on top of the dielectric layer 111, covering the area to be kept or to be removed, depending on the type of photoresist material used. The extra material at each layer may be removed using etch or any other methods.

Spacers 130 may be formed around the stack of layers comprising the high-k layer 104, the work function layer 105, the metal stop layer 107, the conductive layer 109, and the dielectric layer 111. The spacers 130 may comprise a silicon nitride material. The spacers 130 may be deposited by, for example, chemical vapor deposition, and then the unnecessary part is removed horizontally. The spacers 130 may be formed to a thickness of from about 30 nanometers to about 70 nanometers.

Another cross-section view for the transistor 100 along the cross-section line C-C' in FIG. 1(a) is illustrated in FIG. 1(c). The metal gate 121 is over the high-k layer 104, which is over the isolation area 102 and the active area 101, while the isolation area 102 is next to the active area 101. The metal gate 121 comprises the work function layer 105, the metal stop layer 107, and the conductive layer 109. The dielectric layer 111 is over the metal gate 121. The first contact part 1134 is formed within the conductive layer 109, and the second contact part 1132 is formed above the first contact part 1134, and within the dielectric layer 111. Many of the details of the components are similar to the descriptions above for FIG. 1(b). Additional details are provided below.

The isolation area 102, such as a shallow trench isolation (STI) or any other isolation structure, may be formed surrounding the active area 101, prior to the formation of the gate stack 121. The isolation area 102 may be formed by using photolithography techniques to form recesses. Generally, photolithography involves depositing a photoresist material (not illustrated), which is then masked, exposed, and developed. After the photoresist mask is patterned, an etching process may be performed. The etching process may be a wet or dry, anisotropic or isotropic, etch process. The recesses are then filled with a dielectric material such as an oxide layer formed by any oxidation process, such as wet or dry thermal oxidation in an ambient comprising an oxide, $H_2O$, NO, or a combination thereof, or by CVD techniques using tetra-ethyl-ortho-silicate (TEOS) and oxygen as a precursor. A planarization step may be performed to planarize the surface of the isolation material. The planarization step may be accomplished, for example, using a chemical mechanical polishing (CMP) process known and used in the art.

The first contact part 1134 may be formed within the conductive layer 109 of the metal gate 121, above the isolation area 102 without vertically overlapping the active area 101. The second contact part 1132 is formed above the first contact part 1134 and connected to the first contact part 1134, substantially vertically contained within the first contact part 1134. The size of the second contact part 1132 may be determined by a specific technology used in fabricating the transistor, such as the size of a via used in the technology, while the size of the first contact part 1134 is bigger than the size of the second contact part 1132, measured by width or radius, or other related measurements. For example, when the first contact part 1134 and the second contact part 1132 are a circle, a radius of the second contact part 1132 may be about 20% less than a radius of the first contact part 1134. Alternatively, the first contact part 1134 and the second contact part 1132 may be a rectangle, a width of the second contact part 1132 may be about 20% less than a width of the first contact part 1134.

By enlarging the first contact part 1134 contained within the conductive layer 109 of the metal gate and removing a large part of the conductive layer 109, the resistance between the first contact part 1134 and the conductive layer 109 may be reduced due to the fact that the contact area of the remaining conductive layer 109 is bigger. As such the performance of the metal gate 121 may be improved.

The first contact part 1134 and the second contact part 1132 may be formed with a conductive material selected from the group comprising copper, tungsten, aluminum, silver, gold, a combination thereof, and/or the like. The first contact part 1134 and the second contact part 1132 may be formed of a compound comprising a semiconductor material and a metal such as cobalt (Co) or nickel (Ni).

The second contact part 1132 may be further connected to other contacts (not illustrated) in metal layers above the dielectric layer 111 by way of via through inter-metal dielectric layers, which are not shown. There may be multiple metal layers above the dielectric layer 111 and the second contact part 1132. On top of the metal layers, a passivation layer and an under-bump metallization (UBM) structure may be formed for packaging the device comprising the transistor 100.

Figure 2A:
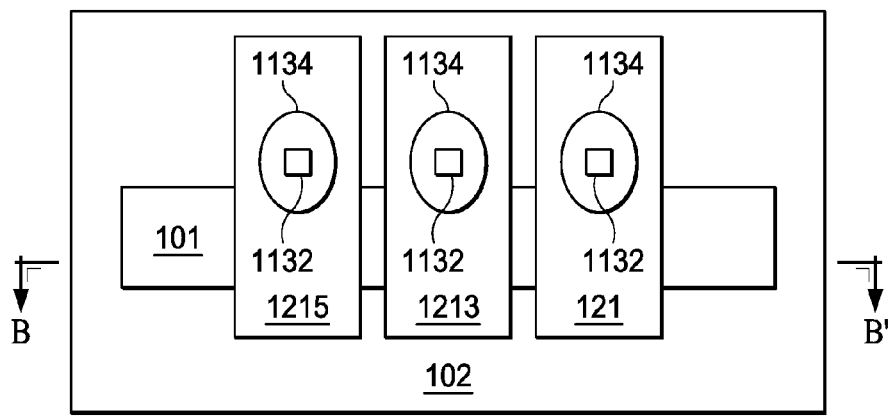
FIGS. 2(a)-2(b) illustrate a cross-sectional view and a top view of a plurality of metal gate transistors within an active area in accordance with some embodiments.
Figure 2B:
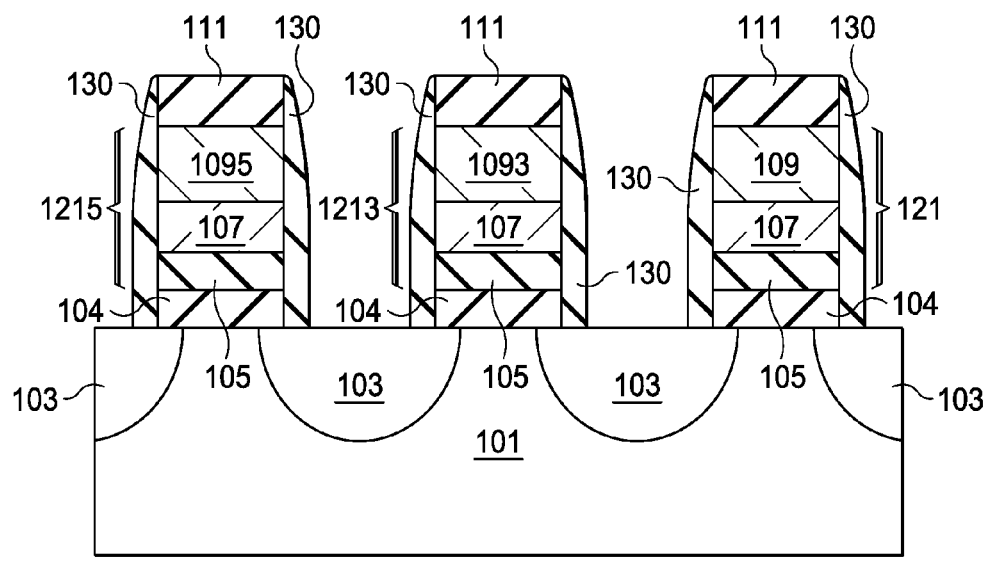

FIGS. 2(a)-2(b) illustrate another embodiment of metal transistors formed within an active area. While the device shown in FIGS. 1(a)-1(c) comprises one transistor, there may be multiple transistors formed within the active area 101. As illustrated in FIG. 2(a), for an active area 101, there may be multiple transistors, such as three transistors, formed. For example, in addition to the metal gate 121 as shown in FIG. 1(a), a second metal gate 1213 and a third metal gate 1215 are formed over the isolation area 102, and above the active area 101, for two additional transistors respectively. Each metal gate comprises a first contact part 1134 and a second contact part 1132 as described for FIGS. 1(a)-1(c). A cross section view of the three transistors formed sharing the active area 101 is shown in FIG. 2(b), as the cross-section view along the cross-section line B-B' in FIG. 2(a). Additional details of the components for FIGS. 2(a)-2(b) are similar to the details for FIGS. 1(a)-1(c). The three transistors shown are merely an example. There may be any other number of transistors formed within the active area 101.

Figure 3A:
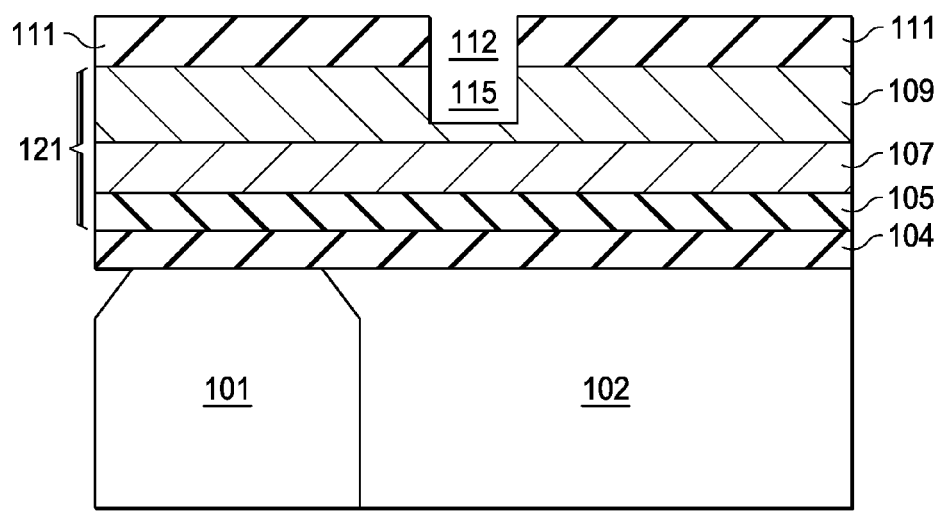
FIGS. 3(a)-3(e) illustrate in cross-sectional views a process of forming a contact for a metal gate transistor with reduced resistance, in accordance with some embodiments.
Figure 3B:
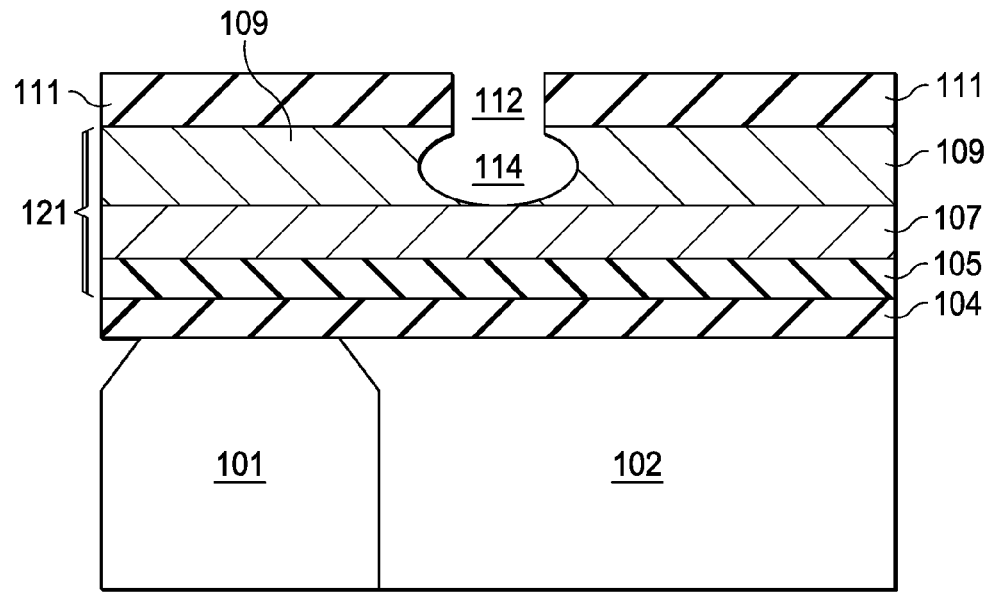
Figure 3C:
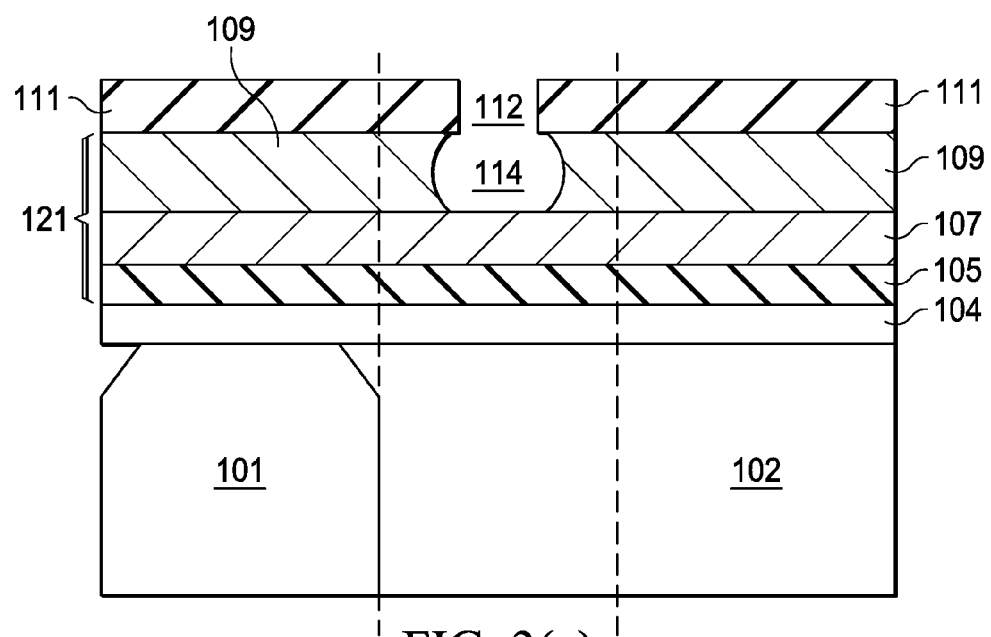
Figure 3D:
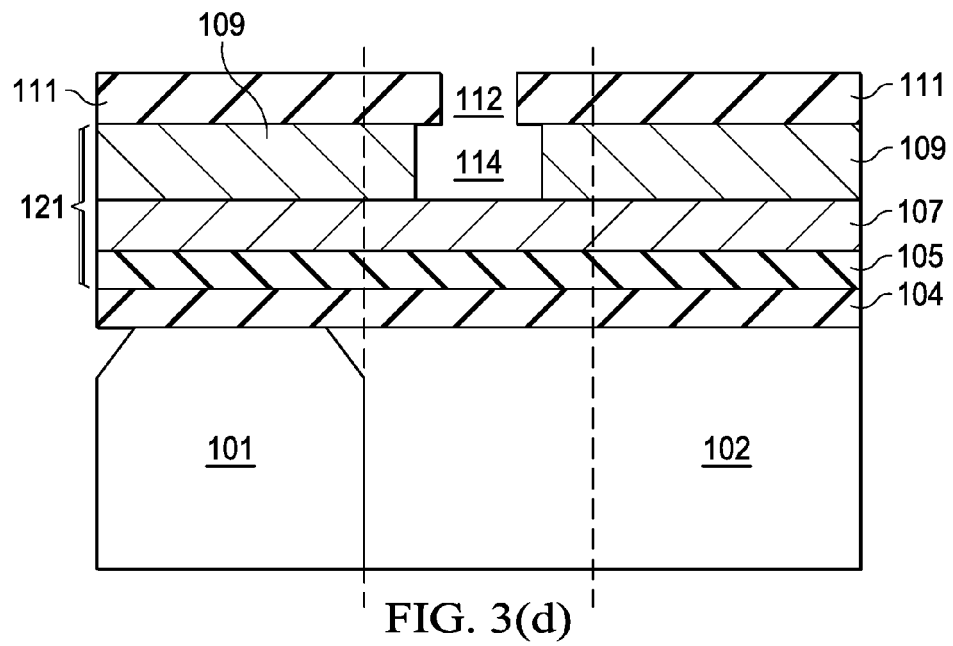
Figure 3E:
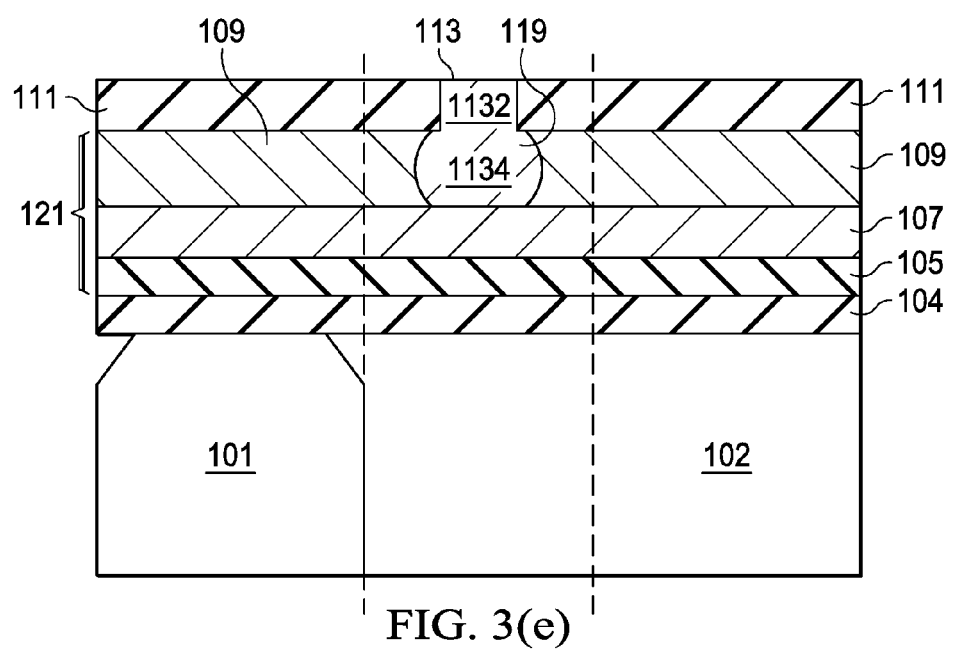

FIGS. 3(a)-3(e) illustrate in cross-sectional views a process of forming the contact 113 comprising the first contact part 1134 and the second part 1132 shown in FIG. 3(e), for a metal gate transistor, wherein the first contact part 1134 and a second part 1132 are vertically over the isolation area 102.

As illustrated in FIG. 3(a), the active area 101 may be formed within a substrate next to the isolation area 102. The active area 101 may comprise the source/drain regions 103 for a transistor, and the channel 106 between them, which are not shown. The high-k layer 104 is formed above the channel 106 and the isolation area 102. The metal gate 121 is formed on the high-k layer 104. The dielectric layer 111 is on the metal gate 121. Additional spacers (not shown) may be formed around the metal gate 121, the high-k layer 104, and the dielectric layer 111. In an embodiment, the metal gate 121 comprises the work function layer 105, the metal stop layer 107, and the conductive layer 109.

Still as illustrated in FIG. 3(a), a first opening 115 is formed within the conductive layer 109, and a second opening 112 is formed within the dielectric layer 111, wherein the first opening 115 and the second opening 112 are connected, and are initially of a similar shape. The first opening 115 and the second opening 112 may be formed by dry etch of the conductive layer 109 and the dielectric layer 111, using, e.g., photolithography masking and etching process. The second opening 112 may be formed through the dielectric layer 111. The first opening 115 may reach the bottom of the conductive layer 109 and stop at the metal stop layer 107. Alternatively, the first opening 115 may stop before reaching the bottom of the conductive layer 109 as shown in FIG. 3(a). The size of the first opening 115 and the second opening 112 may be in a range from about 2 um to about 10 um. The first opening 115 and the second opening 112 may be of various shapes, such as a circle, a square, a rectangle, a diamond, and so on.

As illustrated in FIGS. 3(b)-3(d), the first opening 115 is further expanded to form a third opening 114 within the conductive layer 109. The third opening 114 may be of various shapes such as a circle as shown in FIGS. 3(b)-3(c), a rectangle or a square as shown in FIG. 3(d). The third opening 114 and the second opening 112 may be of a same shape such as circles but in different sizes. Alternatively, the third opening 114 may be of a first shape and the second opening 112 may be of a second shape different from the first shape.

The third opening 114 may be of various sizes such as it has a first size shown in FIG. 3(b) or a second size as shown in FIG. 3(c). The third opening 114 may be formed by expanding the first opening 115 using a wet etch. The wet etch stops at the metal stop layer 107, which may be a TiAl material or some other material. The size (the radius of a circle or a width of a rectangle) of the third opening 114 may be in a range from about 2 nm to about 100 nm. The size of the third opening 114 is bigger than the size of the second opening 112, measured by width or radius, or other related measurements. For example, when the third opening 114 and the second opening 112 are a circle when looked from above, a radius of the second opening 112 may be about 20% less than a radius of the third opening 114. Alternatively, the third opening 114 and the second opening 112 may be a rectangle in a cross-sectional view, a width of the second opening 112 may be about 20% less than a width of the third opening 114.

The wet etch expanding the first opening 115 to form a larger third opening 114 may be performed using chemicals such as tris-borate-ethylene diamine tetraacetic acid (EDTA) (TBE) and dilute TBE, SC2, Ammonium hydroxide-hydrogen Peroxide Mixture (APM) and dilute APM, HF and dilute HF, Sulfuric Peroxide Mixture (SPM), deionized (DI) water with ozone added ($O_3$), $H_3PO_4$, $HNO_3$, and $CH_3COOH$. The etching time may be determined by the size of the desired third opening 114. The third opening 114 may stop at the metal stop layer 107. The third opening 114 is vertically above the isolation area 102, without overlapping the active area 101, so that the threshold voltage of the transistor would not be affected.

As illustrated in FIG. 3(e), a conductive material 119 is used to fill the third opening 114 and the second opening 112. The first contact part 1134 is formed within the conductive layer 109 filling the third opening 114. The second contact part 1132 is formed above the first contact part 1134, and within the dielectric layer 111 by filling the second opening 112. The conductive material 119 may be formed by an electro-chemical plating process, ALD, CVD, a combination thereof, and/or the like. The conductive material 119 may be selected from the group comprising tungsten, aluminum, silver, gold, a combination thereof, and/or the like.

The first contact part 1134 and the second contact part 1132 may be formed of a compound comprising a semiconductor material and a metal such as cobalt (Co) or nickel (Ni). Excess conductive material may be removed by, for example, CMP. The first contact part 1134 and the second contact part 1132 may be formed at a same time or at a different time, with a same material or with a different material.

By enlarging the first contact part 1134 contained within the conductive layer 109 of the metal gate and removing a large part of the conductive layer 109, the resistance between the first contact part 1134 and the conductive layer 109 may be reduced due to the fact that the contact area of the remaining conductive layer 109 is bigger. As such the performance of the metal gate 121 may be improved.

Embodiments are disclosed in the context of forming a contact for a metal gate transistor so that the metal gate has a smaller resistance. In some embodiments, a method of manufacturing a device includes providing a first device with an isolation area, an active area next to the isolation area, a metal gate above the isolation area and the active area, and a dielectric layer above the metal gate. The method also includes forming a first opening within a conductive layer of the metal gate, and a second opening within the dielectric layer. The first opening and the second opening are connected, and are of a first shape. The method further includes expanding the first opening to form a third opening within the conductive layer of the metal gate, the third opening being of a second shape and beneath the dielectric layer, forming a first contact part by filling the third opening within the conductive layer, and forming a second contact part by filling the second opening, with the first contact part being connected to the second contact part.

Embodiment methods are disclosed in the context of forming a contact for a metal gate transistor so that the metal gate has a smaller resistance. In some embodiments, a method of manufacturing a semiconductor device includes forming a metal gate over an active area and vertically above an isolation area, the metal gate including a conductive layer, forming a dielectric layer over the conductive layer, and forming a contact extending through the dielectric layer and into the conductive layer. The contact has a first width in the conductive layer and a second width in the dielectric layer. The second width is smaller than the first width, with the first width and the second width being measured along an axis orthogonal to a longitudinal axis of the metal gate.

Embodiments are disclosed in the context of forming a contact for a metal gate transistor so that the metal gate has a smaller resistance. In various embodiments, a method of forming a semiconductor structure includes forming an active area next to an isolation area, forming a high dielectric constant (high-k) layer above the active area and extending over the isolation area, and forming a metal gate on the high-k layer. The forming the metal gate includes forming successively over the high-k layer a work function layer, a metal stop layer, and a conductive layer. The method further includes forming a dielectric layer above the metal gate, and forming a contact connected to the metal gate. The contact extends vertically through the dielectric layer into the conductive layer without extending through the metal stop layer. The contact has a first width in the conductive layer and a second width in the dielectric layer. The second width is smaller than the first width along an axis orthogonal to a longitudinal axis of the metal gate.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a device comprising:
providing a first device with an isolation area, an active area next to the isolation area, a metal gate above the isolation area and the active area, and a dielectric layer above the metal gate;
forming a first opening within a conductive layer of the metal gate, and a second opening within the dielectric layer, wherein the first opening and the second opening are connected, and are of a first shape;
expanding the first opening within the conductive layer of the metal gate to form a third opening, wherein the third opening is of a second shape and beneath the dielectric layer; and
forming a first contact part by filling the third opening within the conductive layer, and forming a second contact part by filling the second opening, wherein the first contact part is connected to the second contact part.

2. The method of claim 1, wherein the first contact part has a first width along a first direction perpendicular to a longitudinal direction of the metal gate, the second contact part has a second width along the first direction, the second width being smaller than the first width.

3. The method of claim 2, wherein the second width is about 20% less than the first width.

4. The method of claim 1, wherein the first contact part and the second contact part are formed together of a same conductive material.

5. The method of claim 1, wherein the first shape is different from the second shape.

6. The method of claim 1, wherein the metal gate comprises a metal stop layer disposed between the conductive layer of the metal gate and the active area, wherein the forming the first opening exposes the metal stop layer.

7. The method of claim 1, wherein the metal gate comprises a metal stop layer disposed between the conductive layer of the metal gate and the isolation area, wherein a bottom of the first opening extends into the conductive layer and stops before reaching the metal stop layer.

8. The method of claim 1, wherein the metal gate further comprises a work function layer and a metal stop layer, the work function layer and the metal stop layer underlying the conductive layer, with the metal stop layer disposed between the conductive layer and the work function layer.

9. The method of claim 1, wherein the first device further comprises a high dielectric constant (high-k) layer on the isolation area and the active area, and below the metal gate.

10. The method of claim 1, wherein the first opening, the second opening and the third opening are formed directly above the isolation area without vertically overlapping the active area.

11. The method of claim 1, wherein forming the first opening within the conductive layer of the metal gate and the second opening within the dielectric layer is performed at least in part by a dry etch.

12. The method of claim 1, wherein the expanding the first opening to form the third opening is performed at least in part by a wet etch.

13. A method of manufacturing a semiconductor device comprising:
forming a metal gate over an active area and vertically above an isolation area, the metal gate comprising a conductive layer;
forming a dielectric layer over the conductive layer; and
forming a contact extending through the dielectric layer and into the conductive layer, wherein the contact extends from a first side of the conductive layer to a second side of the conductive layer opposing the first side, wherein the contact has a first width in the conductive layer and a second width in the dielectric layer, wherein the second width is smaller than the first width, and wherein the first width and the second width are measured along an axis orthogonal to a longitudinal axis of the metal gate.

14. The method of claim 13, further comprising forming a high dielectric constant (high-k) layer above the isolation area and below the metal gate.

15. The method of claim 13, wherein the forming the contact further comprises:
forming a first opening in the conductive layer and a second opening in the dielectric layer;
expanding the first opening at least laterally within the conductive layer to form a third opening in the conductive layer; and
filling the third opening and the second opening to form the contact.

16. The method of claim 15, wherein the first opening and the second opening are formed using at least a dry etch process, and wherein the expanding the first opening uses at least a wet etch process.

17. The method of claim 15, wherein the filling the third opening and the second opening comprises:
filling the third opening using a first material; and
filling the second opening using a second material different from the first material.

18. A method of forming a semiconductor structure comprising:
forming an active area next to an isolation area;
forming a high dielectric constant (high-k) layer above the active area and extending over the isolation area;
forming a metal gate on the high-k layer, wherein the forming the metal gate comprises forming successively over the high-k layer a work function layer, a metal stop layer, and a conductive layer;
forming a dielectric layer above the metal gate;
forming a contact connected to the metal gate, wherein the contact extends vertically through the dielectric layer into the conductive layer and stops at an interface between the conductive layer and the metal stop layer, wherein the contact has a first width in the conductive layer and a second width in the dielectric layer, and wherein the second width is smaller than the first width along an axis orthogonal to a longitudinal axis of the metal gate.

19. The method of claim 18, wherein the contact is formed above the isolation area without overlapping the active area.

20. The method of claim 18, wherein the contact has a first shape in the dielectric layer and a second shape different from the first shape in the conductive layer.

* * * * *